(12) United States Patent
Novotny et al.

(10) Patent No.: US 7,526,158 B2
(45) Date of Patent: Apr. 28, 2009

(54) SYSTEM AND METHOD FOR HIGH RESOLUTION OPTICAL IMAGING, DATA STORAGE, LITHOGRAPHY, AND INSPECTION

(75) Inventors: Lukas Novotny, Pittsford, NY (US); Thomas G. Brown, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 10/068,449

(22) Filed: Feb. 7, 2002

(65) Prior Publication Data

US 2002/0114567 A1 Aug. 22, 2002

Related U.S. Application Data

(60) Provisional application No. 60/267,112, filed on Feb. 7, 2001.

(51) Int. Cl.
*G02B 6/26* (2006.01)
(52) U.S. Cl. ................. 385/33; 385/31; 369/112.23; 359/642
(58) Field of Classification Search ................ 385/33, 385/31, 12; 359/642; 369/112.23, 112.2; 250/306, 311
See application file for complete search history.

(56) References Cited

U.S. PATENT DOCUMENTS

| | | | |
|---|---|---|---|
| 3,962,505 A | 6/1976 | Avery | |
| 4,342,503 A * | 8/1982 | Shafer | 359/729 |
| 4,437,746 A * | 3/1984 | Ikemori | 396/272 |
| 4,937,808 A * | 6/1990 | Shimada et al. | 369/112.24 |
| 4,947,034 A | 8/1990 | Wickramasinghe et al. | |
| 4,955,685 A | 9/1990 | Garman | |
| 4,994,818 A * | 2/1991 | Keilmann | 343/786 |
| 5,004,307 A | 4/1991 | Kino et al. | |
| 5,121,256 A | 6/1992 | Corle et al. | |
| 5,125,750 A | 6/1992 | Corle et al. | |
| 5,452,384 A | 9/1995 | Kurita et al. | |
| 5,497,359 A | 3/1996 | Mamin et al. | |
| 5,729,393 A | 3/1998 | Lee et al. | |
| 5,793,584 A | 8/1998 | Knight et al. | |
| 5,828,482 A | 10/1998 | Jain | |
| 5,859,814 A | 1/1999 | Kino et al. | |

(Continued)

OTHER PUBLICATIONS

Terris et al., "Near-Field Optical Data Storage Using a Solid Immersion Lens," *Appl. Phys. Lett.* 65:388-390 (Jul. 1994).

(Continued)

*Primary Examiner*—Sung H Pak
*Assistant Examiner*—Mike Stahl
(74) *Attorney, Agent, or Firm*—Nixon Peabody LLP (57) ABSTRACT

A system for applications, such as imaging, lithography, data storage, and inspection, includes an optical element, at least one structure, and a source of light. The structure is at least partially in and at least adjacent a surface of the optical element. The source of light has a mode profile that provides an electric field which has a vector component substantially perpendicular to a surface of the optical element. The source of light is positioned to propagate at least a portion of the light through the optical element onto the object. The structure enhances the electric field of the light which optically interacts with the object.

64 Claims, 7 Drawing Sheets
(3 of 7 Drawing Sheet(s) Filed in Color)

U.S. PATENT DOCUMENTS

| | | | |
|---|---|---|---|
| 5,881,042 A | 3/1999 | Knight | |
| 5,883,872 A | 3/1999 | Kino | |
| 5,883,988 A * | 3/1999 | Yamamoto et al. | 385/14 |
| 5,895,972 A | 4/1999 | Paniccia | |
| 5,917,788 A | 6/1999 | Mowry | |
| 5,923,086 A | 7/1999 | Winer et al. | |
| 5,936,928 A | 8/1999 | Jain et al. | |
| 5,939,709 A | 8/1999 | Ghislain et al. | |
| 5,946,281 A | 8/1999 | Ito et al. | |
| 5,963,532 A | 10/1999 | Hajjar | |
| 5,978,139 A | 11/1999 | Hatakoshi et al. | |
| 5,995,292 A | 11/1999 | McDonald | |
| 6,009,064 A | 12/1999 | Hajjar | |
| 6,036,324 A * | 3/2000 | Bernacki et al. | 359/859 |
| 6,044,041 A | 3/2000 | Ishizaki et al. | |
| 6,055,220 A | 4/2000 | Mamin et al. | |
| 6,055,222 A | 4/2000 | Knight | |
| 6,061,322 A | 5/2000 | Jain et al. | |
| 6,064,529 A | 5/2000 | McDonald et al. | |
| 6,091,549 A | 7/2000 | McDonald et al. | |
| 6,091,694 A | 7/2000 | Späth | |
| 6,101,155 A | 8/2000 | Mowry | |
| 6,104,687 A | 8/2000 | Lee et al. | |
| 6,108,135 A | 8/2000 | Ho | |
| 6,111,840 A | 8/2000 | Hajjar | |
| 6,114,689 A | 9/2000 | Cho et al. | |
| 6,115,192 A | 9/2000 | McDonald | |
| 6,115,347 A | 9/2000 | Ichimura et al. | |
| 6,130,789 A | 10/2000 | Aarts et al. | |
| 6,137,632 A | 10/2000 | Bernacki | |
| 6,154,326 A | 11/2000 | Ueyanagi et al. | |
| 6,157,598 A | 12/2000 | Mowry | |
| 6,163,415 A | 12/2000 | Lee et al. | |
| 6,181,478 B1 | 1/2001 | Mandella | |
| 6,243,350 B1 | 6/2001 | Knight et al. | |
| 6,324,141 B2 | 11/2001 | Takishima et al. | |
| 6,407,884 B1 | 6/2002 | Osborne et al. | |
| 6,496,468 B2 | 12/2002 | Hajjar et al. | |
| 6,507,540 B1 | 1/2003 | Berg et al. | |
| 6,522,617 B1 | 2/2003 | Berg et al. | |
| 6,529,465 B2 | 3/2003 | Kase et al. | |
| 6,544,716 B1 | 4/2003 | Hajjar et al. | |
| 6,545,969 B1 | 4/2003 | Berg et al. | |
| 6,795,630 B2 * | 9/2004 | Challener et al. | 385/129 |
| 6,934,240 B2 * | 8/2005 | Watanabe et al. | 369/112.23 |
| 6,980,374 B1 * | 12/2005 | Schlesinger | 359/726 |
| 2001/0009541 A1 * | 7/2001 | Ueyanagi | 369/112.23 |
| 2003/0206513 A1 * | 11/2003 | Watanabe et al. | 369/106 |
| 2005/0078565 A1 * | 4/2005 | Peng et al. | 369/13.32 |
| 2005/0146800 A1 * | 7/2005 | Yamada et al. | 359/738 |

OTHER PUBLICATIONS

Novotny et al., "Near-Field Optical Imaging Using Metal Tips Illuminated by Higher-Order Hermite-Gaussian Beams," *Ultramicroscopy* 71:21-29 (1998).

Sánchez et al., "Near-Field Fluorescence Microscopy Based on Two-Photon Excitation with Metal Tips," *Physical Review Letter* 82:4014-4017 (May 1999).

Pohl et al., "Optical Stethoscopy: Image Recording With Resolution λ20," *Appl. Phys. Lett.* 44:651-653 (Apr. 1984).

Lewis et al., "Development of a 500 Å Resolution Light Microscope," *Ultramicroscopy* 13:227-231 (1984).

Betzig et al., "Near-field Optics: Microscopy, Spectroscopy, and Surface Modification Beyond the Diffraction Limit," *Science* 257:189-195 (Jul. 1992).

Smolyaninov et al., "Near-field Direct-write Ultraviolet Lithography and Shear Force Microscopic Studies of the Lithographic Process," *Appl. Phys. Lett.* 67:3859-3861 (Dec. 1995).

Davy et al., "Near-field Optics: Snapshot of the Field Emitted by a Nanosource Using a Photosensitive Polymer," *Appl. Phys. Lett.* 69:3306-3308 (Nov. 1996).

Massanell et al., "Nanowriting on Ferroelectric Surfaces with a Scanning Near-field Optical Microscope," *Opt. Lett.* 21:12-14 (Jan. 1996).

Madsen et al., "Optical Near-field Lithography on Hydrogen-passivated Silicon Surfaces," *Appl. Phys. Lett.* 69:544-546 (Jul. 1996).

Herndon et al., "Near-field Scanning Optical Nanolithography Using Amorphous Silicon Photoresists," *Appl. Phys. Lett.* 74:141-143 (Jan. 1999).

Novotny et al., "Theory of Nanometric Optical Tweezers," *Phys. Rev. Lett.* 79:645-648 (Jul. 1997).

Novotny et al., "Near-field Optical Spectroscopy Based on the Field Enhancement at Laser Illuminated Metal Tips," *Optics and Photonics News* 10:24 (Dec. 1999).

Levi, "Progress Made in Near-field Imaging With Light From a Sharp Tip," *Physics Today* pp. 18-20 (Jul. 1999).

* cited by examiner

SYSTEM AND METHOD FOR HIGH RESOLUTION OPTICAL IMAGING, DATA STORAGE, LITHOGRAPHY, AND INSPECTION

This application claims the benefit of U.S. Provisional Patent Application Ser. No. 60/267,112 filed Feb. 7, 2001.

FIELD OF THE INVENTION

This invention relates to a system and method for high resolution optical imaging, data storage, lithography and inspection.

BACKGROUND OF THE INVENTION

In recent years a novel microscopy, called near-field optical microscopy has extended the range of optical measurements beyond the diffraction limit and stimulated interests in many disciplines, especially material sciences and biological sciences. In the most widely adapted aperture approach, light is sent down an aluminum-coated fiber tip of which the foremost end is left uncoated to form a small aperture.

Unfortunately, only a tiny fraction of the light coupled into the fiber is emitted through the aperture because of the cut-off of propagation of the waveguide modes. The low light throughput and the finite skin depth of the metal are the limiting factors for resolution. This applies also to optical lithography since a large photon flux has to be ensured. Nowadays it is doubted that an artifact-free resolution of 50 nm will be surpassed by the aperture technique. Many applications in nanotechnology, such as nanolithography or the optical characterization of semiconductor nanostructures, require higher spatial resolutions.

Moreover, the aperture technique has other practical complications: 1) it is difficult to obtain a smooth aluminum coating on the nanometric scale which introduces non-reproducibility in probe fabrication as well as measurements; 2) the flat ends of the aperture probes are not suitable for simultaneous topographic imaging of high resolution; 3) the absorption of light in the metal coating causes significant heating and poses a problem for temperature sensitive applications.

Despite these limitations, various proposals for nanolithography using the near-field aperture approach have been put forth. In these experiments, patterning on the order of ≈100 nm has been demonstrated in conventional photoresists, photosensitive polymers, ferroelectric surfaces, and hydrogenerated amorphous silicon photoresists. Near-field optical lithography is unlikely to become speed-competitive with emerging parallel exposure technologies, such as X-ray lithography, because of the mechanical resonances associated with the scanning process; a problem inherent to all scanning probe techniques. On the other hand, it provides the capability and advantage of simultaneous modification, imaging and surface characterization.

SUMMARY OF THE INVENTION

A system in accordance with one embodiment of the present invention includes an optical element, at least one structure, and a source of light. The structure is at least partially in and at least adjacent a surface of the optical element. The source of light has a mode profile that provides an electric field which has a vector component substantially perpendicular to the surface of the optical element (longitudinal field). The source of light is positioned to propagate at least a portion of the light through the optical element onto an object. The structure enhances the electric field of the light which optically interacts with the object.

A method in accordance with another embodiment of the present invention includes providing an optical element with at least one structure at least partially and at least adjacent to a surface of the optical element and then directing light with a radially polarized mode profile through at least a portion of the optical element on to an object, the structure enhancing the electric field of the light which optically interacts with the object.

A lens in accordance with another embodiment of the present invention includes an optical element and a structure at least partially in and at least adjacent a surface of the optical element.

A method for making a lens in accordance with another embodiment of the present invention includes providing an optical element, forming at least one opening in a surface of the optical element, and depositing a material in the at least one opening to form a structure.

The present invention provides a number of advantages including providing increased spatial resolution for applications, such as optical imaging, data storage, lithography and inspection, although the present invention can be used in other applications. More specifically, the present invention is able to increase the resolution of near field optical imaging by a factor of two to five beyond that achieved with prior techniques using conventional solid immersion lens. Imaging to ten nm is possible with the present invention. Another advantage of the present approach is that it is non-intrusive, i.e. it is not based on a mechanical interaction between probe and sample. Further, with the present invention storage density is increased by a factor of about twenty to thirty.

BRIEF DESCRIPTION OF THE DRAWINGS

This patent or application file contains at least one drawing executed in color. Copies of this patent or patent application publication with color drawing(s) will be provided by the Office upon request and payment of the necessary fee.

DETAILED DESCRIPTION

A system 10(1) in accordance with one embodiment of the present invention is illustrated in FIGS. 1A-1D. The system 10(1) includes a focusing lens 14, a solid immersion lens 16(1), a structure 18(1), and a source of light 20. The present invention provides a number of advantages including providing a system 10(1) and method for increased spatial resolution for applications, such as optical imaging, data storage, lithography and inspection.

Referring more specifically to FIGS. 1A-1D, the system 10(1) includes the source of laser light 20 and the focusing lens 14, although other types of light sources and other optical components, if any, can be used to direct the light from the source of light 20 on to the solid immersion lens 16(1). The source 20 outputs a laser light 22 that has a mode profile that provides an electric field which has a vector component substantially perpendicular to the surface of the solid immersion lens 16(1). The lens 14 focuses the light 24 and directs it on to the solid immersion lens 16(1).

Figures 1A, 1B:
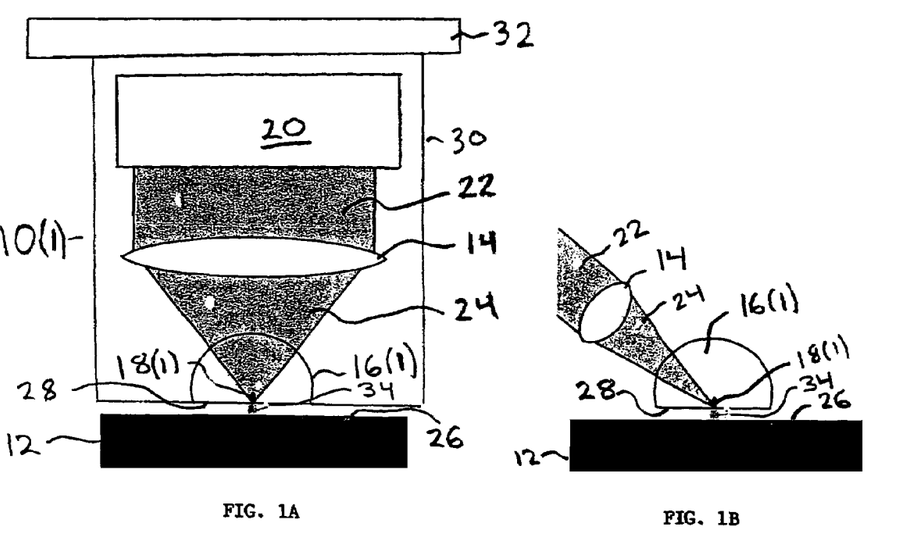
FIGS. 1A-1D are diagrams of a system for high resolution optical imaging in accordance with one embodiment of the present invention with different illumination paths.

The solid immersion lens 16(1) is positioned to receive the focused light 24 from the focusing lens 14 and to localize the light on the surface 26 of an object or substrate 12, although other types of optical elements can be used for solid immersion lens 16(1). For example, an optical waveguide 36 can be used as the optical element as illustrated in FIG. 2. In this particular embodiment shown in FIGS. 1A-1D, the solid immersion lens 16(1) has a semi-circular configuration with a surface 28 which is substantially parallel to the surface of the object being imaged, although the lens 16(1) can have other configurations. In this particular embodiment, the separation between the solid immersion lens 16(1) and the surface 26 of the object 12 is smaller than the wavelength of the laser light 22 from the source 20, although other spacing arrangements can be used.

The structure 18(1) is embedded along one surface 28 of the solid immersion lens 16(1), although the number of structures and their location in the solid immersion lens 16(1) or other optical element can vary. In this particular embodiment, the structure 18(1) has an elongated shape, although the structure 18(1) can have other shapes and can be located in other positions in the solid immersion lens 16(1) as illustrated in the embodiments shown in FIGS. 2-4, 5D, and 6E. The structure 18(1) is able to locally enhance the electric field of the incoming laser light 24.

The system 10(1) is contained in a housing 30, although other arrangements for housing the system 10(1) can be used. A guiding system 32 is connected to the housing 30 and guides the solid immersion lens 16(1) in the housing 30 over the surface 26 of the object 12 to achieve high optical resolutions for applications, such as imaging, data storage, surface modification, and lithography, although other configurations for the present invention can be used. For example, the system 10(1) may not have a guiding system 32 and system 10(1) could be stationary while the object 12 could be moved by another system with respect to the solid immersion lens 16(1). A variety of different types of guiding systems can be used, such as mechanical positioning systems or optical systems which are used to guide the system. Since guiding systems are well know to those of ordinary skill in the art, they will not be described in detail here. For ease of illustration, the housing 30 and guiding system 32 have been removed in FIGS. 1B-1D.

The operation of the system 10(1) will now be described with reference to FIGS. 1A-1D. In this method, a fundamental Gaussian laser mode is passed through or reflected from a phase plate which delays one half of the beam by a phase shift of 180 degrees. Subsequent spatial filtering selects the desired 'Hermite-Gaussian 10' mode. If strongly focused, then a longitudinal field is generated in the focus. This procedure is outlined in L .Novotny, E. J. Sanchez, and X. S. Xie, "Near-field optical imaging using metal tips illuminated by higher-order Hermite-Gaussian beams," Ultramicroscopy vol. 71, pp. 21-29, 1998, which is herein incorporated by reference. The two orthogonal 'Hermite-Gaussian 10' modes can be superimposed using, for example, the method is described in U.S. patent application Ser. No. 09/759,913, filed on Jan. 12, 2001 which is commonly owned and is herein incorporated by reference.

The source 20 outputs laser light 22 onto the focusing lens 14 which directs the focused light 24 on to the solid immersion lens 16(1). The solid immersion lens 16(1) localizes the light 24 on the structure 18(1). The electric field component of the focused light 24 perpendicular to the surface of the solid immersion lens 16(1), referred to as longitudinal field, creates a highly localized, enhanced field 34 at the surface 28 of the lens 16(1) by the structure 18(1). Since the structure 18(1) is in the vicinity of the surface 26 of the object 12, the enhanced field 34 protrudes into the space outside the sold immersion lens 16(1) thereby enabling a highly localized interaction with the surface 26 of the object 12 which is close by. The lateral extent of the enhanced field 34 is smaller than the size of diffraction limited illumination and can reach down to about ten nm.

By guiding the solid immersion lens 16(1) over the surface 26 of the object 12 with the guiding system 32 or by moving the object 12 with respect to the solid immersion lens 16(1) high optical resolutions for applications, such as imaging, lithography, data storage, or surface modification, can be achieved. The solid immersion lens 16(1) may contain many structures 18(1), but in this particular embodiment only structure 18(1) is responsible for the enhanced optical interaction with the surface 26 of the object 12.

Figures 1C, 1D:
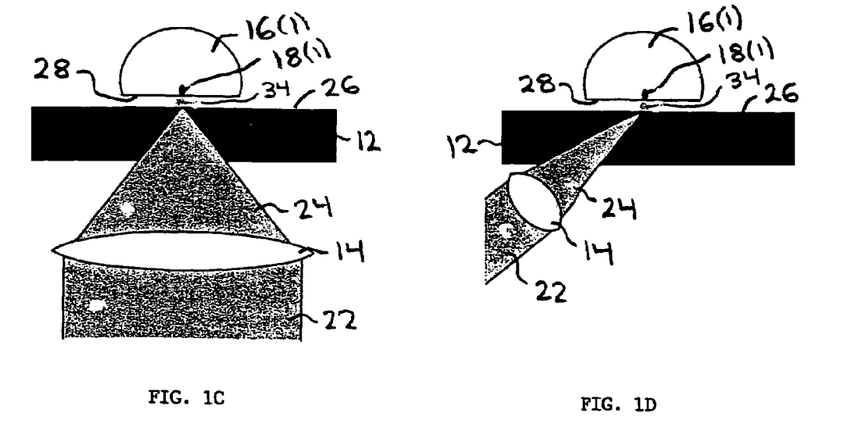
Figure 2:
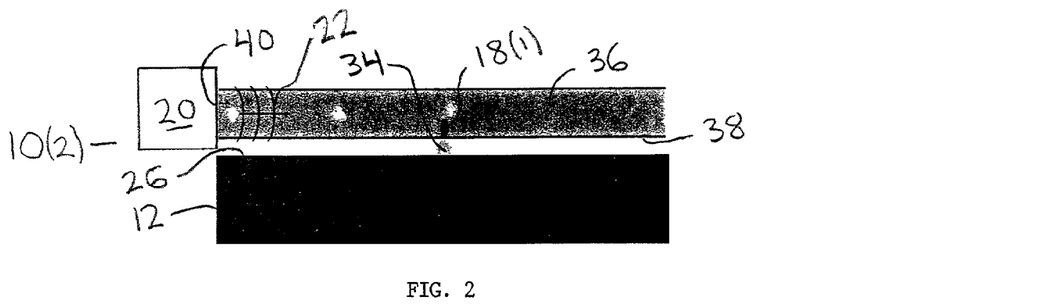
FIG. 2 is a diagram of a system for high resolution optical imaging in accordance with another embodiment of the present invention.

A variety of different illumination paths can be used with the system 10 as shown in FIGS. 1A-1D. For example, a normal incidence illumination with an annular beam is shown in FIG. 1A, an oblique illumination is shown in FIG. 1B, a normal incidence illumination through the object 12 is shown in FIG. 1C, and oblique incidence through the object 12 is shown in FIG. 1D.

Referring to FIG. 2, a system 10(2) in accordance with another embodiment of the present invention is illustrated. Elements in FIG. 2 which are the same as those in FIG. 1 will have the same numeral designations and will not be described again in detail. In this particular embodiment, the solid immersion lens 16(1) in system 10(1) has been replaced in system 10(2) by an optical waveguide 36. A structure 18(1) to locally enhance the electric field 34 of the incoming light is embedded in a surface 38 of the optical waveguide 36, although the number of structures and their location in the optical waveguide 36 or other optical element can vary. A source of light 20 is positioned to direct light 22 into one end 40 of the optical waveguide 36. For ease of illustration, the housing 30 and guiding system 32 is not shown in FIG. 2, but is the same as shown in FIG. 1A.

The operation of the system 10(2) will now be described with reference to FIG. 2. The source 20 outputs laser light 22 into the optical waveguide 36 which directs the light 22 on to the structure 18(1). The electric field component of the light 22 creates a highly localized, enhanced field 34 at the surface 38 of the optical waveguide 36 by the structure 18(1). Since the structure 18(1) is in the vicinity of the surface 26 of the object 12, the enhanced field 34 protrudes into the space outside the optical waveguide 36 thereby enabling a highly localized interaction with the surface 26 of the object 12 which is close by. Again, the lateral extent of the enhanced field 34 is smaller than the size of diffraction limited illumination and can reach down to about ten nm.

By guiding the optical waveguide 36 over the surface 26 of the object 12 with the guiding system 32 or by moving the object 12 with respect to the optical waveguide 36 high optical resolutions for applications, such as imaging, lithography, data storage, and surface modification, can be achieved. The optical waveguide 36 may contain many structures 18(1), but in this particular embodiment only structure 18(1) is responsible for the enhanced optical interaction with the surface 26 of the object 12.

Figure 3:
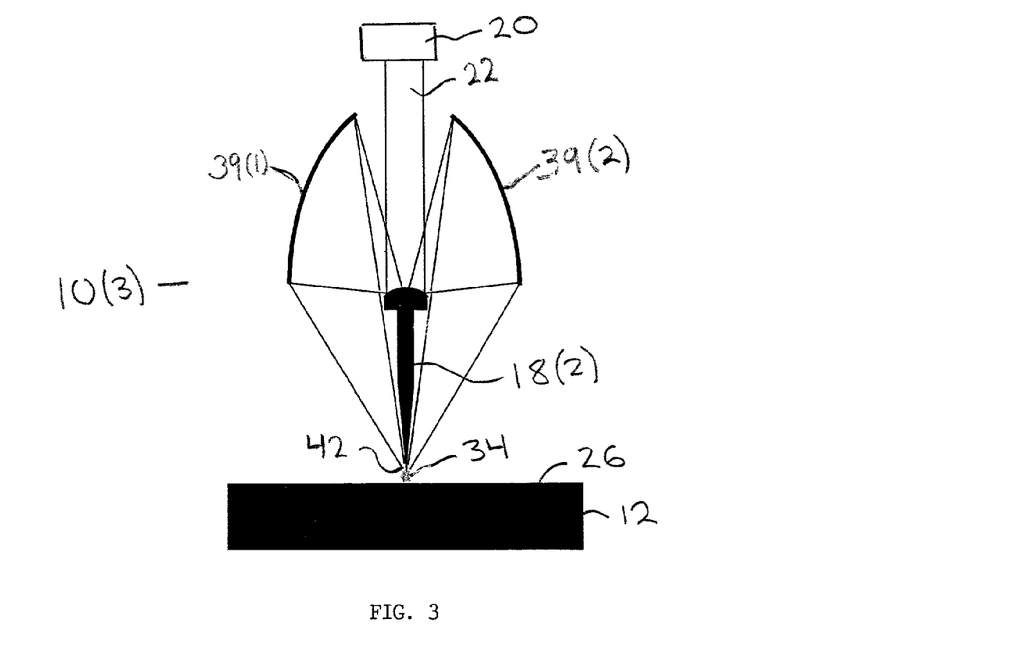
FIG. 3 is a diagram of a system for high resolution optical imaging in accordance with yet another embodiment of the present invention.

Referring to FIG. 3, a system 10(3) in accordance with another embodiment of the present invention is illustrated. Elements in FIG. 3 which are the same as those in FIG. 1 will have the same numeral designations and will not be described again in detail. In this particular embodiment, the solid immersion lens 16(1) has been replaced with a pair of ellipsoidal mirrors 39(1) and 39(2), although other types of reflective objects could be used. A structure 18(2) is supported by the mirrors 39(1) and/or 39(2) by the use of thin radial wires, although other devices for supporting structure 18(2) could be used. The structure 18(2) enhances locally the electric field 34 of the incoming light. The shape of the structure 18(2) comprises a sharp tip in order to provide enhancement of the local field. In this particular embodiment, the structure 18(2) has an elongated shape which extends from a flattened section at one end down to point 42 at another end as shown in FIG. 3. The flattened section of the structure 18(2) has a reflective surface facing the light source 20. The portion of the mirrors 39(1) and 39(2) facing the structure 18(2) also have a reflecting surface. For ease of illustration, the housing 30 and guiding system 32 is not shown in FIG. 3, but is the same as shown in FIG. 1A.

The operation of the system 10(3) will now be described with reference to FIG. 3. The source 20 outputs laser light 22 onto the flattened section of the structure 18(2). The laser light is reflected off of the flattened section of the structure 18(2) and onto the reflecting surfaces of mirrors 39(1) and 39(2). The mirrors 39(1) and 39(2) focus the light 22 from the flattened section of the structure 18(2) onto the tip 42 of the structure 18(2). This path of the light 22 is illustrated in FIG. 3. The electric field component of the light 22 creates a highly localized, enhanced field 34 at the point 42 of the structure 18(2). Since the structure 18(2) is in the vicinity of the surface 26 of the object 12, the enhanced field 34 protrudes into the space outside the structure 18(2) thereby enabling a highly localized interaction with the surface 26 of the object 12 which is close by. Again, the lateral extent of the enhanced field 34 is smaller than the size of diffraction limited illumination and can reach down to about ten nm.

By guiding the mirrors 39(1) and 39(2) and structure 18(2) over the surface 26 of the object 12 with the guiding system 32 or by moving the object 12 with respect to the mirrors 39(1) and 39(2) and structure 18(2) high optical resolutions for applications, such as imaging, lithography, data storage, and surface modification, can be achieved. The system may contain many structures 18(2), but in this particular embodiment only one structure 18(2) is responsible for the enhanced optical interaction with the surface 26 of the object 12.

Figure 4:
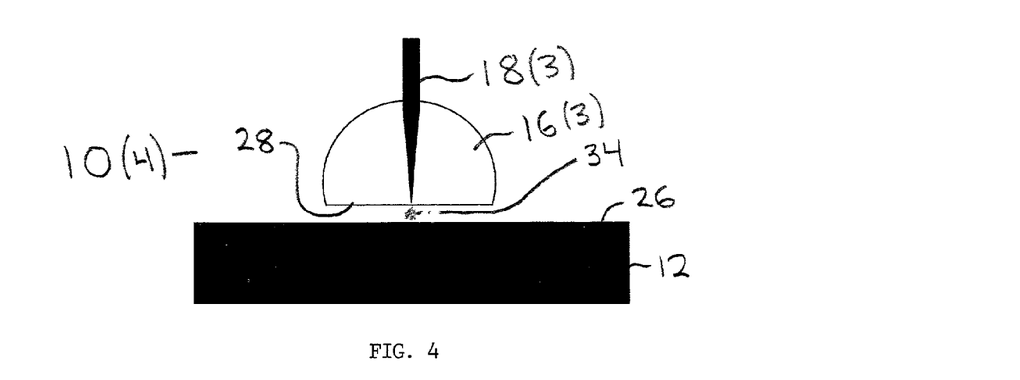
FIG. 4 is a diagram of a system for high resolution optical imaging in accordance with yet another embodiment of the present invention.

Referring to FIG. 4, a system 10(4) in accordance with another embodiment of the present invention is illustrated. Elements in FIG. 4 which are the same as those in FIG. 1 will have the same numeral designations and will not be described again in detail. In this particular embodiment, solid immersion lens 16(3) is the same as solid immersion lens 16(1) described earlier, except the opening for the structure 18(3) is larger and extends through the lens 16(3). In this particular embodiment, the structure 18(3) has an elongated shape which extends through the solid immersion lens 16(3) and converges to a point adjacent the surface 28 of the solid immersion lens 16(3). For ease of illustration, the source of light 20, the housing 30 and guiding system 32 are not shown in FIG. 4, but are the same as shown in FIG. 1A.

The operation of the system 10(4) will now be described with reference to FIG. 4. A source 20 outputs laser light 22 onto the solid immersion lens 16(3) which directs the light 22 on the structure 18(3). The electric field component of the light 22 creates a highly localized, enhanced field 34 at the surface 28 of the solid immersion lens 16(3) by the structure 18(3). Since the structure 18(3) is in the vicinity of the surface 26 of the object 12, the enhanced field 34 protrudes into the space outside the solid immersion lens 16(3) thereby enabling a highly localized interaction with the surface 26 of the object 12 which is close by. Again, the lateral extent of the enhanced field 34 is smaller than the size of diffraction limited illumination and can reach down to about ten nm.

By guiding the solid immersion lens 16(3) over the surface 26 of the object 12 with the guiding system 32 or by moving the object 12 with respect to the solid immersion lens 16(3) high optical resolutions for applications, such as imaging, lithography, data storage, and surface modification, can be achieved. The solid immersion lens 16(3) may contain many structures 18(3), but in this particular embodiment only structure 18(3).

Figure 5A:
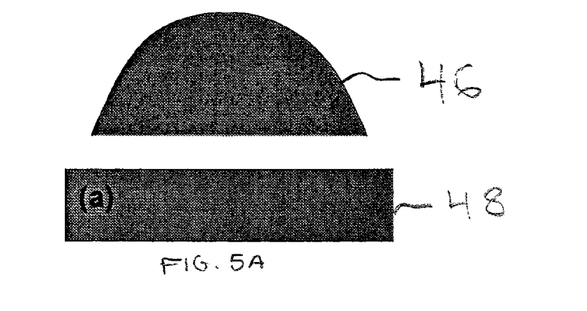
FIGS. 5A-5D are diagrams of a method for making a solid immersion lens in accordance with one embodiment of the present invention.

Referring to FIGS. 5A-5D, a process for making a solid immersion lens 16(4) in accordance with an embodiment of the present invention is illustrated. An optical base 46 is secured along one surface to one surface of an optical layer 48 as shown in FIG. 5A. Although in this particular embodiment, the optical base 46 has a semi-circular construction to focus incoming light, other shapes for optical base 46 can be used. Additionally, although one optical layer 48 is shown, other numbers of optical layers can be used.

Figure 5B:
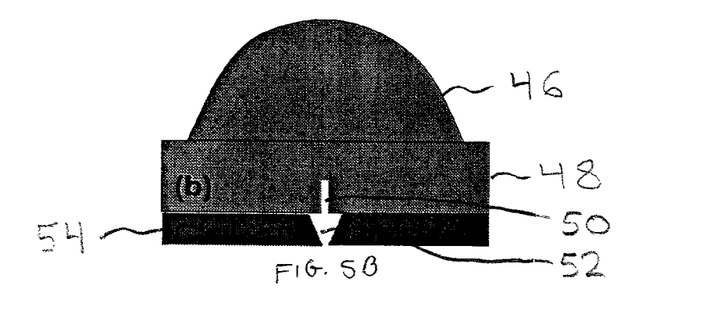

A groove 50 is formed in another surface of the optical layer 48 to receive the structure 18(4) as shown in FIG. 5B. In this particular embodiment, the groove 50 has a rectangular shape and a width or diameter of about ten to twenty nm holes, although the optical layer 48 may have other numbers of grooves and the groove or grooves may have other shapes and sizes. Another conical shaped opening 52 is formed in another layer 54, although the layer 54 may have other numbers of conical shaped openings and the conical shaped opening or conical shaped openings may have other shapes. In this embodiment, the layer 54 is secured to the optical layer 48 so that the groove 50 is in alignment with the conical opening 52.

By way of example only, the groove 50 and conical shaped opening 52 can be formed using standard nano-lithographical techniques.

Figure 5C:
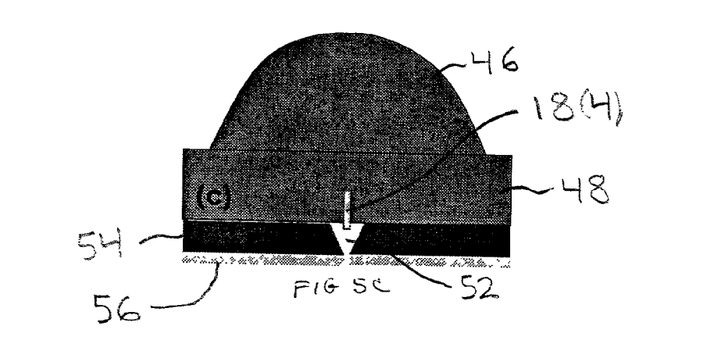

Another layer 56 is formed on the layer 54 and an opening is formed in the layer to the conical shaped opening 52 as shown in FIG. 5C. Material for the structure 18(4) is deposited in the groove 50 and protrudes out into the conical shaped opening 52.

Figure 5D:
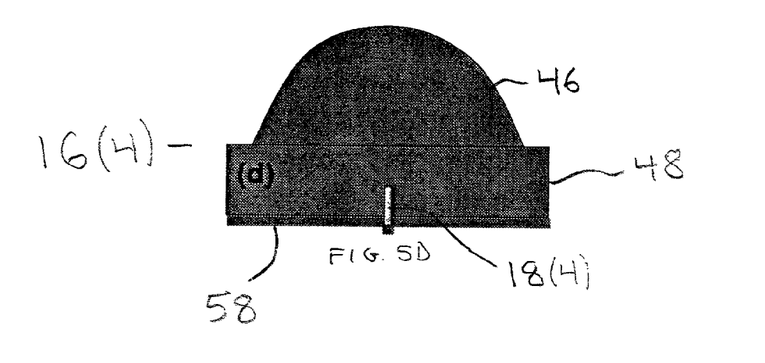

The layers 54 and 56 are removed from the surface of layer 48 to expose the protruding portion of the structure 18(4) as shown in FIG. 5C. A protective dielectric layer 58, such as $Si_3N_4$, is deposited on the protruding portion of structure 18(4) and over the surface of layer 48 on which layer 54 was once deposited to protect the protruding portion of structure 18(4) against mechanical damage. The solid immersion lens 16(4) is now ready for high resolution imaging.

Figure 6A:
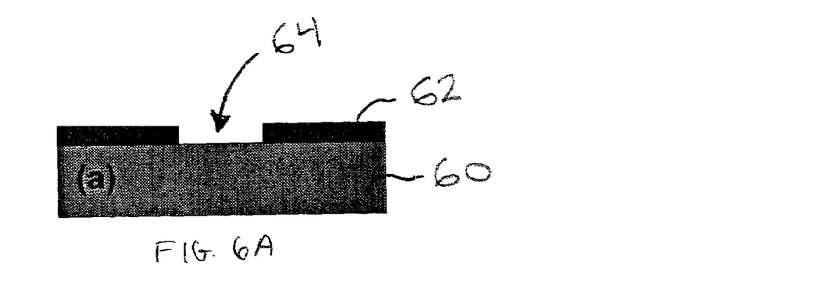
FIGS. 6A-6E are diagrams of a method for making a solid immersion lens in accordance with another embodiment of the present invention.

Referring to FIGS. 6A-6E, a process for making a solid immersion lens 16(5) in accordance with an embodiment of the present invention is illustrated. A layer 62 is deposited on a layer 60 and an opening 64 is etched in the layer 62 to the layer 60 as shown in FIG. 6A. Although one opening 64 is shown, other numbers of openings could be formed in layer 62.

Figure 6B:
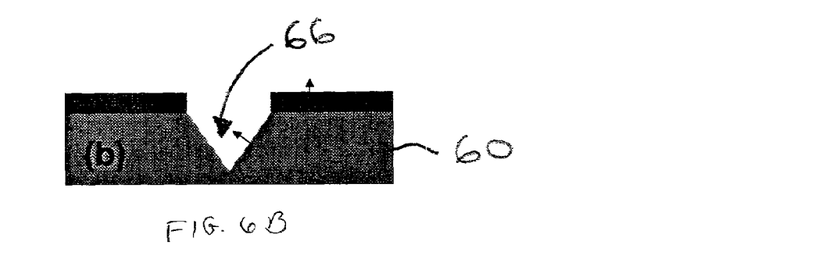

Next, a conical shaped opening 66 is formed in layer 60 below hole 64 as shown in FIG. 6B. The opening 66 can be formed by chemically etching, although other techniques for forming holes can be used. Additionally, although one opening 66 is shown and the opening 66 has a conical shape, other numbers of openings and with other shapes can be used.

Figure 6C:
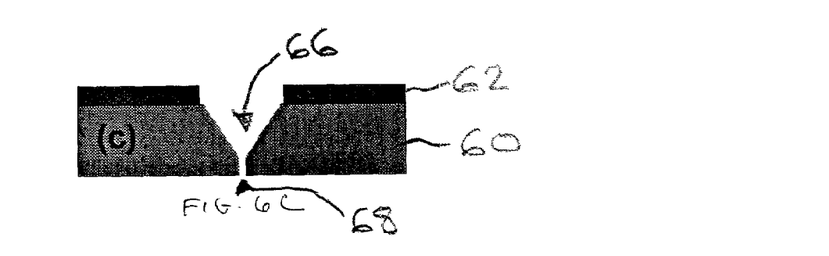

Next, hole 68 is formed in the layer 60 at the apex of conical shaped opening 66 and extends through the layer 60 as shown in FIG. 6C. In this particular embodiment, the hole has a cylindrical shape and a width or diameter of about ten nm, although opening 68 can have other shapes and sizes.

Figure 6D:
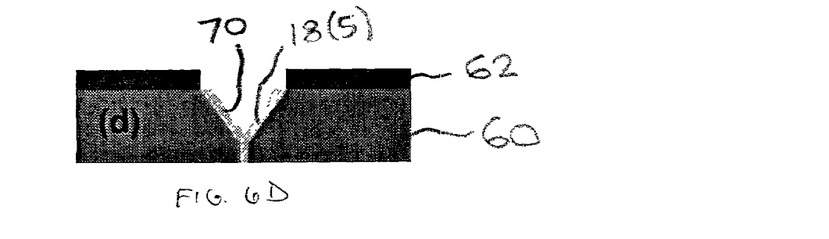

Next, a material is deposited in the opening 66 and opening 68 to form the structure 18(5) as shown in FIG. 6D. In this particular embodiment, the material is a metallic material, such as gold or silver, although other types of materials could be used.

Figure 6E:
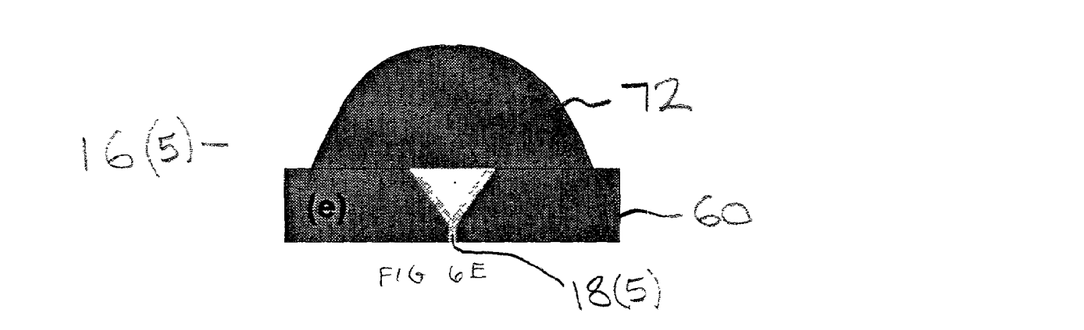

Next, layer 62 is removed and an optical base 72 is secured to the layer 60 over the opening 66 with structure 18(5) as shown in FIG. 6E. Although in this particular embodiment, the optical base 72 has a semi-circular shape to focus incoming light, other shapes for optical base 72 can be used. The solid immersion lens 16(5) is now ready for applications, such as high resolution imaging.

Figure 7A:
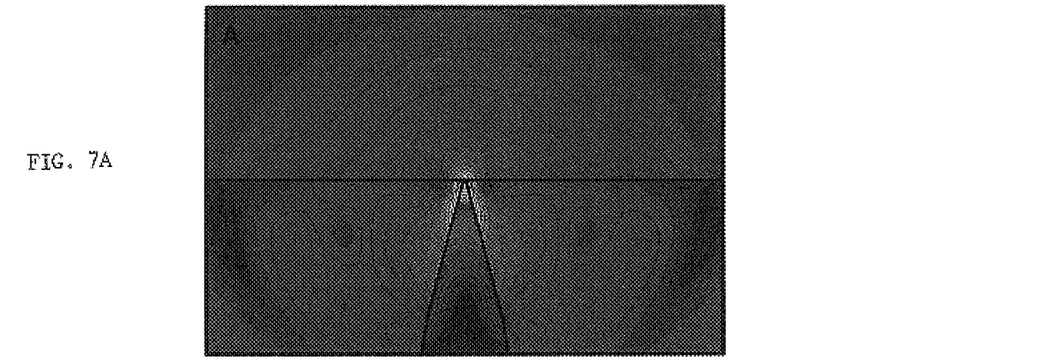
FIG. 7A is a diagram illustrating a calculated field distribution for a focused radially polarized laser beam incident on a dielectric/air interface with an aluminum tip in an optical element in a system.
Figure 7B:
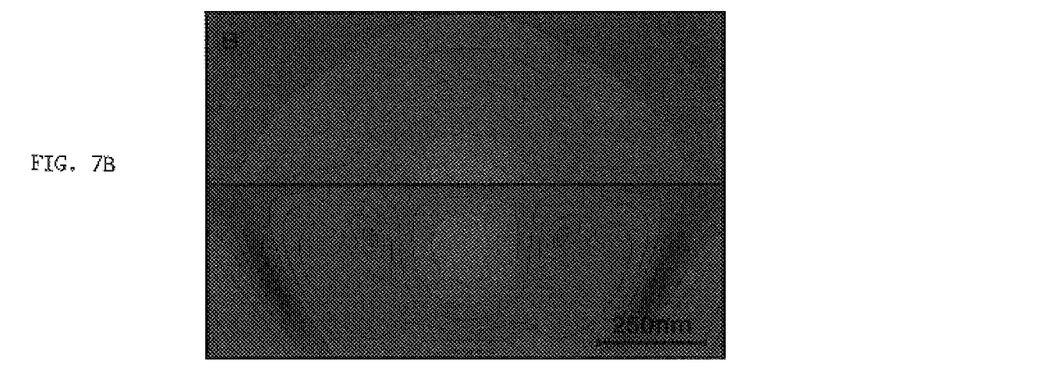
FIG. 7B is a diagram illustrating a calculated field distribution for a focused radially polarized laser beam incident on a dielectric/air interface without any field enhancing structure in the optical element in a system.

Calculations based on Maxwell's equations prove the feasibility of the present invention. These calculations have been carried out by using the multiple multipole method (MMP). These results are shown in FIGS. 7A and 7B which illustrate the calculated field distribution ($E^2$, factor of two between adjacent contour lines) for a focused, radially polarized laser beam incident on a dielectric/air interface: (A) with an aluminum tip close to the interface shown in FIG. 7A, (B) without any field enhancing structure shown in FIG. 7B. In these figures, the boundaries between different media are indicated by solid lines. The metal tip attracts the fields and concentrates them towards the interface.

In this particular example, the following parameters were used: wavelength=800 nm, numerical aperture=1.789, dielectric constant of lower space=3.2, dielectric constant of upper space=1, dielectric constant of aluminum tip=24.1+i1.5, end diameter of tip=10 nm, distance of tip from interface=5 nm. A radially polarized laser beam is focused on the interface of an optical element with a flat surface. A tip-shaped aluminum particle is placed in close proximity to the surface of the optical element, such as a solid immersion lens 16. The end diameter of the tip-shaped particle is 10 nm and the distance to the surface of the optical element is 5 nm. The incoming radially polarized laser light has a wavelength of 800 nm. The figure shows contour lines of constant electric field intensity on a logarithmic scale.

Figure 8:
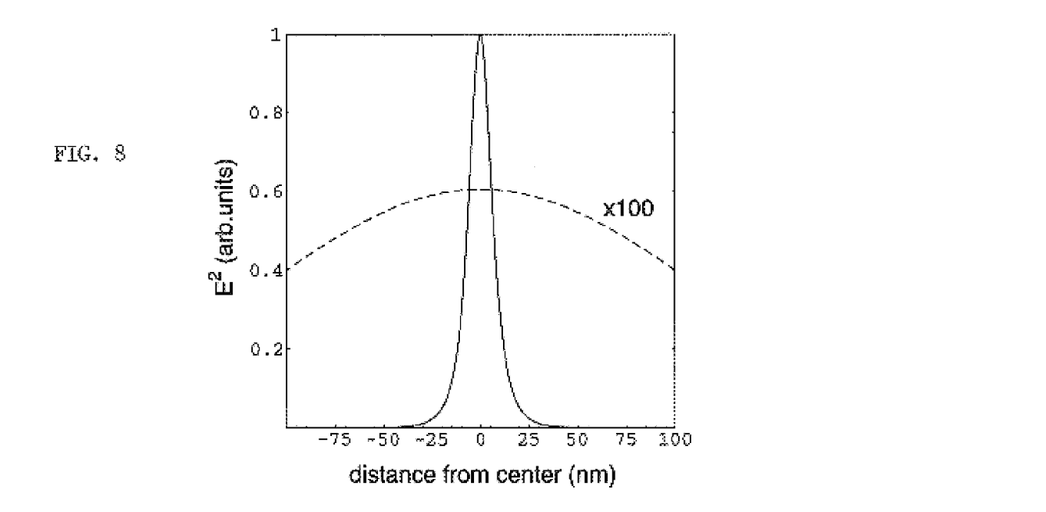
FIG. 8 is a graph illustrating fields above an interface with (solid line) and without (dashed line) a field enhancing structure in the optical element in the system.

Referring to FIG. 8, electric field intensities evaluated one nm above the interface with (solid line) and without (dashed line) the metal tip-shaped particle are illustrated. In this particular example, all of the parameters are the same as those discussed above with reference to FIGS. 7A and 7B. The peak field strength for the case with tip is ~165 times stronger than without the tip. The full-width at half maximum (FWHM) for the case with tip is on the order of the tip diameter (10 nm) whereas for the case without tip a diffraction limited spot with FWHM of ~300 nm is obtained. This figure demonstrates that the spatial extent of the fields can be reduced by a factor of thirty increasing the data density on a surface by a factor of ~900. This figure demonstrates the much smaller spotsize that can be achieved by using a small structure to enhance the fields. In this particular example the optical data density can be increased by roughly a factor of 900.

Figure 9A:
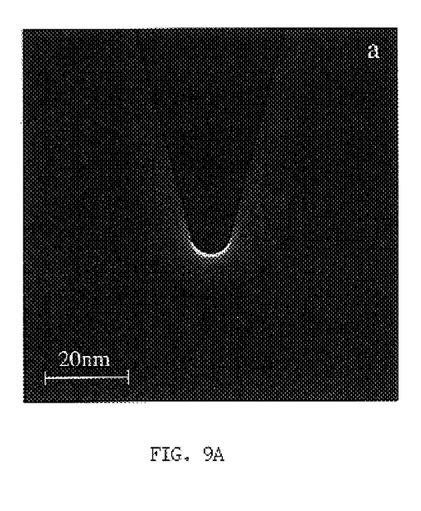
FIG. 9A is a diagram of the calculated near-field of a gold tip illuminated by a plane wave polarized along the tip axis in accordance with one example.
Figure 9B:
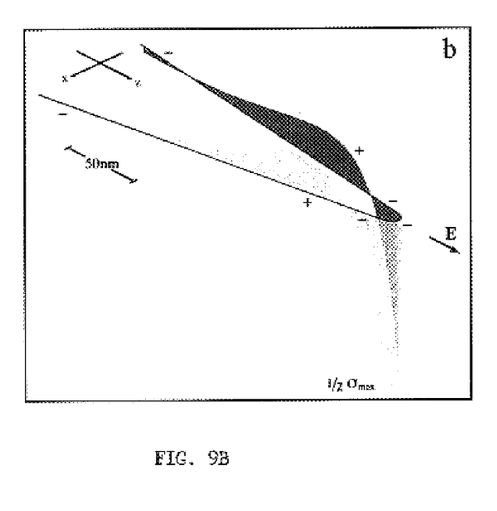
FIG. 9B is a diagram of the induced surface charge density.

As discussed above, to overcome the limitation of the aperture technique discussed earlier, the present invention introduces an apertureless scheme. The present invention makes use of the strongly enhanced electric field close to a sharply pointed metal tip under laser illumination. The energy density close to the metal tip is shown to be two to four orders of magnitude larger than the energy density of the illuminating laser light as shown by way of example in FIGS. 9A and 9B. The calculated near-field of a gold tip illuminated by a plane wave polarized along the tip axis is shown in FIG. 9A. The excitation wavelength is $\lambda=810$ nm and the electric field intensity ($E^2$) is strongly enhanced at the tip. Induced surface charge density is shown in FIG. 9B. The surface charges form an oscillating standing wave. The large surface charge accumulation at the foremost part is responsible for the field enhancement.

Figure 10A:
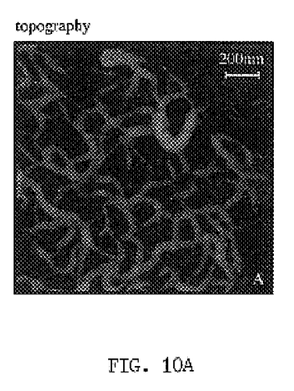
FIG. 10A is a simultaneous topographic image of J-aggregates of PIC dye in a PVS film on a glass substrate.
Figure 10B:
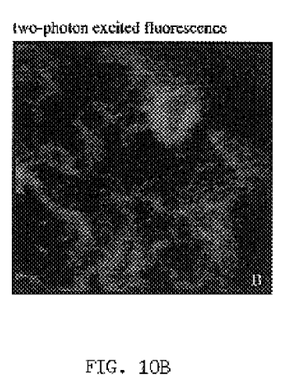
FIG. 10B is a near-field two-photon excited fluorescence image of J-aggregates of PIC dye in a PVS film on a glass substrate.
Figure 10C:
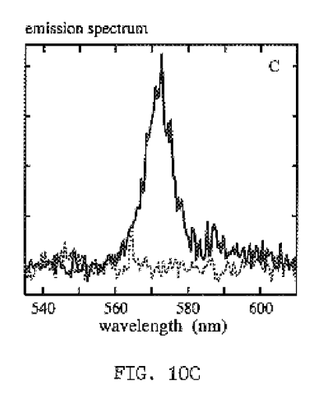
FIG. 10C is a graph of the corresponding fluorescence emission spectrum obtained with (solid line) and without (dashed line) a field enhancing structure in the optical element in the system in accordance with the present invention.

This effect is strongly dependent on the polarization of the illuminating light. Only light polarized along the tip axis induces a surface charge accumulation at the end of the tip which then gives rise to the field enhancement. In experiments, the laser illuminated tip was held a few nanometers above the sample surface so that a highly localized interaction between the enhanced field and the sample is achieved. In order to obtain a high image contrast, nonlinear optical interactions between tip and sample were investigated. Resolutions on the order of twenty nm were demonstrated by making use of the field enhancement effect combined with two-photon excitation of the sample. In these experiments, the sample was locally excited by the simultaneous absorption of two photons. The subsequent fluorescent emission was detected and used to construct an optical image of high resolution by raster scanning the sample. An example of these results is shown in FIGS. 10A-10C. A simultaneous topographic image and a near-field two-photon excited fluorescence image of J-aggregates of PIC dye in a PVS film on a glass substrate are shown in FIGS. 10A and 10B, respectively. Corresponding fluorescence emission spectrum obtained with (solid line) and without (dashed line) the tip present are shown in FIG. 10C. Accordingly, these experimental and theoretical results support the idea of using the present invention to perform high resolution optical lithography.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefor, is not intended to limit the claimed processes to any order except as may be specified in the claims. Accordingly, the invention is limited only by the following claims and equivalents thereto.

What is claimed is:

1. A system comprising:
   an optical element;
   at least one structure at least partially in a non-opaque portion of the optical element and at least adjacent a surface of the optical element, wherein the structure is elongated with opposing narrow ends, one of the opposing narrow ends is adjacent the surface of the optical element and the other opposing narrow end is further from the surface than the one of the opposing narrow ends and is spaced in from other surfaces of the optical element; and
   a source of light with a mode profile that provides an electric field which has a vector component substantially perpendicular to the surface of the optical element, the source positioned to propagate at least a portion of the light through the optical element on to an object, the structure enhancing the electric field of the light which optically interacts with the object.

2. The system as set forth in claim 1 further comprising a guiding system that moves at least one of the optical element with the structure or the object.

3. The system as set forth in claim 1 further comprising a focusing lens positioned to focus the light from the source on to the optical element.

4. The system as set forth in claim 1 wherein the optical element is a solid immersion lens.

5. The system as set forth in claim 1 wherein the optical element is an optical waveguide.

6. The system as set forth in claim 1 wherein the structure extends in a direction which is substantially perpendicular to the surface of the optical element.

7. The system as set forth in claim 1 wherein the structure protrudes out past the surface of the optical element.

8. The lens as set forth in claim 7 further comprising a coating over at least a portion of the structure that protrudes out past the surface of the optical element.

9. A system comprising:
   an optical element;
   at least one structure at least partially in a non-opaque portion of the optical element and at least adjacent a surface of the optical element; and
   a source of light with a mode profile that provides an electric field which has a vector component substantially perpendicular to the surface of the optical element, the source positioned to propagate at least a portion of the light through the optical element on to an object, the structure enhancing the electric field of the light which optically interacts with the object;
   wherein the optical element comprises an optical base and an optical layer connected to the optical base, the structure is at least partially in and at least adjacent to a surface of the optical layer which is adjacent to a vicinity where the enhanced electric field protrudes from the optical element.

10. The system as set forth in claim 9 wherein the structure is elongated and protrudes out past the surface of the optical layer.

11. The system as set forth in claim 10 further comprising a coating over at least a portion of the structure that protrudes out past the surface of the optical layer.

12. The system as set forth in claim 9 further comprising an opening extending through the optical layer, wherein the structure is located in at least a portion of the opening.

13. The system as set forth in claim 12 wherein at least a portion of the opening has a conical shape and wherein the sides of the conical portion are substantially straight.

14. A method comprising:
   providing an optical element with at least one structure at least partially in a non-opaque portion of the optical element and at least adjacent to a surface of the optical element, wherein the structure is elongated with opposing narrow ends, one of the opposing narrow ends is adjacent the surface of the optical element and the other opposing narrow end is further from the surface than the one of the opposing narrow ends and is spaced in from other surfaces of the optical element; and
   directing light with a mode profile that provides an electric field which has a vector component substantially perpendicular to the surface of the optical element through at least a portion of the optical element on to an object, the structure enhancing the electric field of the light which optically interacts with the object.

15. The method as set forth in claim 14 further comprising guiding at least one of the directed light or the object.

16. The method as set forth in claim 14 further comprising focusing the light on to the optical element.

17. The method as set forth in claim 14 wherein the optical element is a solid immersion lens.

18. The method as set forth in claim 14 wherein the optical element is an optical waveguide.

19. The method as set forth in claim 14 wherein the structure extends in a direction which is substantially perpendicular to the surface of the optical element.

20. The method as set forth in claim 14 wherein the structure protrudes out past the surface of the optical element.

21. The method as set forth in claim 20 further comprising a coating over at least a portion of the structure that protrudes out past the surface of the optical layer.

22. A method comprising:
   providing an optical element with at least one structure at least partially in a non-opaque portion of the optical element and at least adjacent to a surface of the optical element; and
   directing light with a mode profile through at least a portion of the optical element on to an object, the structure enhancing the electric field of the light which optically interacts with the object;
   wherein the provided optical element comprises an optical base and an optical layer connected to the optical base, the structure is at least partially in and at least adjacent to a surface of the optical layer which is adjacent to a vicinity where the enhanced electric field protrudes from the optical element.

23. The method as set forth in claim 22 wherein the structure is elongated and protrudes out past the surface of the optical layer.

24. The method as set forth in claim 23 further comprising a coating over at least a portion of the structure that protrudes out past the surface of the optical layer.

25. The method as set forth in claim 22 further comprising an opening extending through the optical layer, wherein the structure is located in at least a portion of the opening.

26. The method as set forth in claim 25 wherein at least a portion of the opening has a conical shape and wherein the sides of the conical portion are substantially straight.

27. A lens comprising:
an optical element; and
a structure at least partially in a non-opaque portion of the optical element and at least adjacent a surface the optical element, wherein the structure is elongated and wherein one end of the elongated structure has a tapered section that begins to taper at location spaced in from the surface of the optical element and converges to one tapered end tip adjacent the surface of the optical element, wherein the structure protrudes out past the surface of the optical element and a coating over at least a portion of the structure that protrudes out past the surface of the optical element.

28. The lens as set forth in claim 27 wherein the structure is elongated and extends in a direction which is substantially perpendicular to the surface of the optical element.

29. A lens comprising:
an optical element; and
a structure at least partially in a non-opaque portion of the optical element and at least adjacent a surface of the optical element;
wherein the optical element comprises an optical base and at least one optical layer connected to the optical base, the structure is at least partially in and at least adjacent to a surface of the optical layer from which an enhanced electric field that interacts with an object protrudes from the optical element.

30. The lens as set forth in claim 29 wherein the structure is elongated and protrudes out past the surface of the optical layer.

31. The lens as set forth in claim 30 further comprising a coating over at least a portion of the structure that protrudes out past the surface of the optical layer.

32. The lens as set forth in claim 29 further comprising an opening extending through the optical layer, wherein the structure is located in at least a portion of the opening.

33. The lens as set forth in claim 32 wherein at least a portion of the opening has a conical shape and wherein the sides of the conical portion are substantially straight.

34. A method for making a lens, the method comprising:
providing an optical element;
forming at least one opening in a non-opaque portion of the optical element and adjacent a surface of the optical element; and
depositing a material in the at least one opening to form a structure, wherein the structure is formed to be elongated and wherein one end of the elongated structure has a tapered section that begins to taper at location spaced in from the surface of the optical element and converges to one tapered end tip adjacent the surface of the optical element; and
coating over at least a portion of the structure in the at least one opening.

35. The method as set forth in claim 34 wherein the structure is elongated and extends in a direction which is substantially perpendicular to the surface of the optical element.

36. The method as set forth in claim 34 wherein the structure protrudes out past the surface of the optical element.

37. A method for making a lens, the method comprising:
providing an optical element;
forming at least one opening in a non-opaque portion of the optical element and adjacent a surface of the optical element; and
depositing a material in the at least one opening to form a structure;
wherein the providing the optical element further comprises connecting an optical layer to an optical base, wherein the forming the at least one opening is at least partially in and at least adjacent to a surface of the optical layer from which an enhanced electric field that interacts with an object protrudes from the optical element and the depositing the material is in the at least one opening.

38. The method as set forth in claim 37 wherein the structure is elongated and protrudes out past the surface of the optical layer.

39. The method as set forth in claim 38 further comprising a coating over at least a portion of the structure that protrudes out past the surface of the optical layer.

40. The method as set forth in claim 37 wherein the forming the opening further comprises forming the opening to extend through the optical layer.

41. The method as set forth in claim 40 wherein the forming the opening further comprises forming at least a portion of the opening to have a conical shape and wherein the sides of the conical portion are substantially straight.

42. A system comprising:
at least one elliptical shaped mirror;
at least one structure positioned to optically interact with the elliptical shaped mirror; and
a source of light, the structure reflecting at least a portion of the light on to at least a portion of the elliptical shaped mirror, the elliptical shaped mirror focusing the at least a portion of the light on to at least another substantially opaque portion of the structure enhancing the electric field of the light which optically interacts with an adjacent object.

43. The system as set forth in claim 42 further comprising a guiding system that moves at least one of the elliptical shaped mirror or the object.

44. A system comprising:
at least two elliptical shaped mirrors;
at least one structure positioned to optically interact with the elliptical shaped mirrors; and
a source of light with a mode profile that provides an electric field which has a vector component substantially perpendicular to a surface of the elliptical shaped mirrors, the structure directing at least a portion of the light on to at least a portion of the elliptical shaped mirrors, the elliptical shaped mirrors focusing the at least a portion of the light on to at least another portion of the structure enhancing the electric field of the light which optically interacts with an adjacent object.

45. The system as set forth in claim 42 wherein the structure is elongated and has at least one tip and the elliptical shaped mirror focuses the at least a portion of the light on to the at least one tip.

46. A method comprising:
providing at least one elliptical shaped mirror and at least one structure positioned to optically interact with the elliptical shaped mirror; and
reflecting light with at least a portion of the structure on to at least a portion of the elliptical shaped mirror, the elliptical shaped mirror focusing the light on to at least another substantially opaque portion of the structure enhancing the electric field of the light which optically interacts with an adjacent object.

47. The method as set forth in claim 46 further comprising guiding at least one of the directed light or the object.

48. A method comprising:
providing at least two elliptical shaped mirrors and at least one structure positioned to optically interact with the elliptical shaped mirrors; and
directing light with at least a portion of the structure on to at least a portion of the elliptical shaped mirrors, the elliptical shaped mirrors focusing the light on to at least another portion of the structure enhancing the electric field of the light which optically interacts with an adjacent object.

49. The method as set forth in claim 46 wherein the structure is elongated and has at least one tip.

50. The system as set forth in claim 42 further comprising at least one reflective surface on the structure that reflects at least a portion of the light on to at least a portion of the elliptical shaped mirror.

51. The system as set forth in claim 1 wherein one end of the elongated structure has a tapered section that begins to taper at location spaced in from the surface of the optical element and converges to one pointed tip at one of the narrow ends adjacent the surface of the optical element.

52. The system as set forth in claim 51 wherein the elongated structure extends in a direction which is substantially perpendicular to the surface of the optical element and wherein the optical element is a solid immersion lens.

53. The method as set forth in claim 14 wherein one end of the elongated structure has a tapered section that begins to taper at location spaced in from the surface of the optical element and converges to one pointed tip at one of the narrow ends adjacent the surface of the optical element.

54. The method as set forth in claim 53 wherein the elongated structure extends in a direction which is substantially perpendicular to the surface of the optical element and wherein the optical element is a solid immersion lens.

55. A lens comprising:
an optical element; and
a structure at least partially in a non-opaque portion of the optical element and at least adjacent a surface the optical element, wherein the structure is elongated and wherein one end of the elongated structure has a tapered section that begins to taper at location spaced in from the surface of the optical element and converges to one tapered end tip adjacent the surface of the optical element and wherein the elongated structure extends in a direction which is substantially perpendicular to the surface of the optical element and wherein the optical element is a solid immersion lens.

56. A method for making a lens, the method comprising:
providing an optical element;
forming at least one opening in a non-opaque portion of the optical element and adjacent a surface of the optical element; and
depositing a material in the at least one opening to form a structure, wherein the structure is formed to be elongated and wherein one end of the elongated structure has a tapered section that begins to taper at location spaced in from the surface of the optical element and converges to one tapered end tip adjacent the surface of the optical element and wherein the elongated structure extends in a direction which is substantially perpendicular to the surface of the optical element and wherein the optical element is a solid immersion lens.

57. A system comprising:
an elongated optical element;
at least one opaque structure at least partially in a non-opaque portion of the optical element; and
a source of light positioned to propagate at least a portion of the light through the optical element in a direction generally parallel to a surface of the elongated optical element which faces an object, the opaque structure attracting and concentrating the electric field of the light propagating through the optical element into a space outside the optical element to interact with the object.

58. A method comprising:
providing an elongated optical element with at least one opaque structure at least partially in a non-opaque portion of the optical element and at least adjacent to a surface of the optical element; and
directing light through the elongated optical element in a direction generally parallel to a surface of the elongated optical element which faces an object, the opaque structure attracting and concentrating the electric field of the light into a space outside the optical element to interact with the object.

59. The system as set forth in claim 57 wherein the opaque structure comprises a substantially solid structure between outer surfaces of the opaque structure.

60. The method as set forth in claim 58 wherein the opaque structure comprises a substantially solid structure between outer surfaces of the opaque structure.

61. The system as set forth in claim 57 wherein the opaque structure concentrates and directs the electric field of the light into the space outside the optical element and any other solid element connected to the optical element to interact with the object.

62. The method as set forth in claim 58 wherein the opaque structure concentrates and directs the electric field of the light into the space outside the optical element and any other solid element connected to the optical element to interact with the object.

63. The system as set forth in claim 57 wherein the space is at least one of a gaseous space and a vacuum space.

64. The method as set forth in claim 58 wherein the space is at least one of a gaseous space and a vacuum space.

* * * * *